United States Patent [19]

Salander et al.

[11] Patent Number: 5,250,904
[45] Date of Patent: Oct. 5, 1993

[54] DEVICE FOR PREDICTING IMMINENT FAILURE OF A STATIONARY LEAD ACID BATTERY IN A FLOAT MODE

[75] Inventors: Arthur B. Salander, Commack; Douglas C. Fortner, Setauket, both of N.Y.

[73] Assignee: Advanced Power Technology Inc., Seatuket, N.Y.; by said Douglas Fortner

[21] Appl. No.: 991,481

[22] Filed: Dec. 16, 1992

Related U.S. Application Data

[63] Continuation of Ser. No. 742,022, Aug. 8, 1991, abandoned.

[51] Int. Cl.$^5$ .......................... G01N 27/42; H02J 7/00
[52] U.S. Cl. .......................... 324/430; 320/48; 324/431; 324/433; 340/636
[58] Field of Search .......... 324/426, 430, 431, 433, 324/434, 435; 340/636; 320/48

[56] References Cited
U.S. PATENT DOCUMENTS 3,996,579 12/1976 Dahl ........................ 340/636
4,028,616 6/1977 Stevens ...................... 324/433
4,598,373 7/1986 Morishita et al. ............ 324/430
4,929,931 5/1990 McCuen ..................... 324/434
4,931,738 6/1990 MacIntyre et al. ........... 324/435

Primary Examiner—Gerard R. Strecker
Assistant Examiner—Diep Do
Attorney, Agent, or Firm—Alfred M. Walker

[57] ABSTRACT

A stationary battery testing device as provided for measuring imminent battery failure while the battery is in a float mode. The device includes a circuitry for measuring the internal resistance changes of a battery and then comparing them over a predetermined duration of time so as to provide audible or visual discernable signals to indicate an imminent battery failure after the expiration of said predetermined period of time. An additional temperature monitoring component may be provided for the device to monitor internal changes within the battery with respect to temperature. This can also be combined in a temperature compensated automatic adjustment of voltage and alarm thresholds in an active feedback loop to augment and broaden the basis of stationary battery applications where the battery testing device can be used.

13 Claims, 2 Drawing Sheets

DEVICE FOR PREDICTING IMMINENT FAILURE OF A STATIONARY LEAD ACID BATTERY IN A FLOAT MODE

This application is a continuation of application Ser. No. 07/742,022, filed Aug. 8, 1991, now abandoned.

BACKGROUND OF THE INVENTION

This invention relates to a new and useful device for testing stationary valve regulated and vented lead acid batteries, which provides a prediction of imminent battery failure by means of monitoring a slight change in voltage across the cell or battery terminals, while it is in "float" service, that is neither charging or discharging under use.

The Applicant's device includes an electronic instrument for battery testing, having a single unit electronic instrument capable of detecting slight changes in voltages which affect battery performance. Such variations in voltage are functions of either a short or an open situation, wherein the internal resistance of the battery changes. As a result, the cell voltage is altered across the battery in relation to the voltage drop across the battery.

The device will note such a voltage change while the battery is in a float situation for a pre-set period of time. If the voltage change continues for the duration of a pre-set period of time, such as twenty four hours, the device will indicate possible failure mode by means of both audible and visual alarms. The device may also provide a C form contact for remote indication, and a single digital output.

Applicants' device is not an indicator of a specific voltage, but rather it sets up a benchmark window to see when one battery or cell in a plurality of cells moves up or down in voltage out of the prescribed range of acceptable voltage. The device takes advantage of a predicted rate of failure to alert the user of imminent failure.

Applicant's device is necessary, because batteries are subject to changes in resistance caused by short or open situations, which will eventually result in battery failure.

Therefore the invention will predict with some certainty the appearance of an open or short situation that would invariably result in a battery failure. Since this technique is not currently in use commercially the advantage of this invention over other more laborious and costly methods of predicting failure would then be realized.

The condition of a battery depends upon chemical reactions within the battery. Chemical reactions within lead based batteries are enhanced or decreased depending upon the condition of the plates. If active material sheds, it will be caught in the space between the plates, resulting in a short or less impedance. The shedding process can cause a mixture of shedded plate material with the sulphuric acid medium between the plates. When this action occurs a process similar to plating, involving electrolysis of the suspended active material will create a coating or plating action on the outer walls of the plates within a battery. This creates a layer of lead sulfate that adheres permanently to the surface of the plates and ultimately retards the batteries ability to deliver adequate current. This process is known in the industry as sulphation. Furthermore, normal expansion or contraction of the battery plates or contacts may cause an open situation. This is a result of normal battery use.

Typical battery performance problems, such as grid corrosion, contamination, improper temperature, overcharging and undercharging prematurely age a battery, permanently reducing its functional capacity. Such performance problems are discussed in the specification pamphlet entitled "The Dynasty Battery" of Johnson Controls, Inc., Specialty Battery Division, 900 East Keefe Avenue, Milwaukee, Wis. 53201. The Johnson Controls, Inc.'s pamphlet discusses the monitoring of a battery to insure proper charging, but emphasizes the necessity of "estimating" when a battery needs charging based upon its probable useful life (page 4) and the further requirement of charging with exact parameters.

According to Johnson Controls, Inc. overcharging a battery will result in a continued high current flow, which decomposes battery electrolyte water and ages the battery prematurely. Furthermore, undercharging a battery causes the current flow to stop before the battery is fully charged, which allows some of the lead sulfate to remain on the battery plates and prematurely ages the battery.

In response to these problems, Johnson Controls, Inc. recommends accurately estimating when a battery will need recharging and then properly charging it. It even discusses a simple solution to the problem by using Dynasty batteries of the same age, which allegedly minimizes adverse charging effects by limiting some of the guess work involved in estimating the failure of a battery.

In contrast to the necessity of "guess work" emphasized by Johnson Controls, Inc., Applicant's invention is significant because it provides a circuitry for predicting battery failure due to the normal aging process which as previously described results in slight changes of cell voltage while the battery is in a "float" stage.

Applicant's device is also signifigant because it is not primarily designed to measure possible failure of a battery while the battery is in a "load" mode that is, under specfic use. Previous attempts have been made to measure a battery's voltage while the battery is either charging or discharging during use. What Applicant's device does is rather to measure the potential failure of a battery when the battery is in a static, float mode in between uses.

Such previous attempts to measure a battery's voltage during charge or discharge have been disclosed in U.S. Pat. No. 3,546,576 of J. A. Frezzolini (Ogden Technology Labs, Inc.—assignee). It discloses a means for monitoring a battery during charge and discharge cycles to determine if the voltage remains within an acceptable range.

U.S. Pat. No. 4,020,414 of A. E. Paredes (Konar Corp.—assignee) discloses the use of a quad comparator chip with a scaling network and indicator lights to provide an indication of battery voltage during charge or discharge modes. Paredes specifically is used during a discharge mode referring to battery voltage as a gauge of capacity to forewarn the user of potential failure. This device cannot be used in a static, float mode such as Applicant's device. Paredes is designed to measure voltage across a battery either in an open circuit or in a loaded circuit with an analagous reference to available capacity remaining in the battery. The comparator used in the Paredes device is used as a driver for a digital voltmeter, whose voltage indication is displayed in a serial fashion via an array of light emitting diodes (leds).

U.S. Pat. No. 4,027,231 of D. R. Lohmann (U.S. Army—assignee) discloses a battery voltage indicator employing a scaling network with a plurality of transistor stages having LED indicators, each providing comparison against a Zener diode reference.

U.S. Pat. No. 4,028,616 of C. R. Stevens discloses employing a plurality of integrated op-amps with LEDs and a voltage dividing network to indicate battery voltage during charging or discharging use.

With regard to the Paredes patent, and actually any of the other references, there is a marked difference in operation and technique. Specifically, the Paredes device is designed to measure the voltage across a battery and indicate using either an open circuit or loaded circuit; the available capacity remaining in the battery. It does this by resolving small decreases along an analog slope that begins with a fully charged battery voltage. As that voltage decays it indicates with some relative accuracy the batteries available capacity to some predetermined end voltage. In other words there is a correlation between the open circuit or loaded circuit voltage of a battery and its available capacity.

The capacity in this case is stated in terms of a percentage. The comparator then in the Paredes patent is used as the driver for a digital voltmetering technique. The voltage comparator when combined with a resistor network is responsive in a digital sense to the increase or decrease of a DC voltage source and would function as a voltmeter device based on the value of the resistors used.

In contrast the Applicant's device uses the voltage comparator to indicate a voltage window. Even more important than that simple fact is that Applicant's device specifically is not used to determine battery capacity at all. Applicant's invention is used to predict failure of a battery. Herein lies the difference.

To further explain the difference that exist between Applicant's device and Paredes, it is necessary to explain what one is actually dealing with.

All the other inventions including Paredes deal with the battery primarily under load; that is to say in use as a voltage producing device. With Applicant's invention one is specifically making one's measurement only under the following specific conditions:

1. The battery is neither under load nor open circuit.
2. The battery is in a float-charge condition.
3. The battery charger is of the constant voltage/current limited type.

What Applicant is resolving is a shift in voltage across the battery due to a change in internal resistance. The change would be caused by either an internal shorting or opening of the battery itself. This effect will cause the voltage (IR) to either drop or increase slightly across that portion of the battery. This shift of voltage would not be perceived by measuring the entire battery and would only be perceived at the terminals of the offending cell/battery during the measurement conditions mentioned above.

Also, the unit when it is first set up, is adjusted to compensate for the batteries' internal resistance when newly installed, which can be different for each individual battery or cell in a given string. Therefore, in the final analysis, it is the specific voltage shift of a given battery cell that more precisely predicts imminent failure.

This is far different than using the gradual decline of cell voltage under load to perceive available battery capacity, as is being done in the Paredes patent. Additionally, the product applications are very different. In the Paredes example one is dealing with an automotive or marine type application, where batteries are not float charged on a continuous basis. The device Applicant designed is specifically used for stationary applications where the battery is float charged. While there are possibilities for its' use in "motive" applications, such as certain shipboard or aircraft applications, the measurement conditions Applicant's invention requires are generally not available in motive applications.

OBJECTS OF THE INVENTION

It is an object of the present invention to provide an instrument which accurately predicts battery failure.

It is a further object of the present invention to provide an instrument which accurately predicts battery failure while a battery is in a float charge mode.

It is a further object of the present invention to monitor ambient or single cell/battery temperature.

It is a further object of the present invention to provide a battery voltage monitor which allows the user to take individual battery cell readings while the battery is in a float mode.

It is a further object of the present invention to provide a battery monitor for a plurality of batteries which will indicate whether a battery has experienced a voltage change during a float mode which will likely result in an imminent battery failure.

It is a further object of the present invention to provide a battery voltage monitor which uses a voltage regulator to isolate and control input to a voltage comparator circuit, with a resistor ladder circuit, to cause input signals to be excited and to deliver a discernable output signal, to indicate changes in voltage levels within a prescribed voltage window.

It is a further object of the invention to provide a battery voltage monitor which uses an optically isolated sensing means to excite a transistor to turn on a relay that provides a discernable signal to indicate imminent battery failure.

It is a further object of the invention to provide a predetermined time duration measuring means for measuring voltage changes in a battery and delaying a response to such changes until the expiration of the predetermined time duration to eliminate false alarms of imminent battery failure.

A further object of the invention is to provide a novel battery testing monitor for stationary batteries in which internal resistance changes of a battery in a static, float mode are utilized to predict imminent battery failure in an efficient manner.

It is a further object of the invention to provide a battery voltage monitoring device which is an improvement over existing battery testing devices.

In furtherance of these and other objects which will become apparent, what is provided by the present invention is an electronic circuit instrument for creating a time duration voltage "window" of acceptable voltage measurements over a predetermined period of time. The instrument accurately predicts imminent battery failure while a battery or series of batteries are in a float mode of non-use by taking individual battery cell readings and measuring internal resistance changes which would more than likely indicates conditions in the battery, if outside certain limits, that would indicate a possible performance failure of the battery when called upon for service.

The device uses a voltage regulator to isolate and control input to a voltage comparator circuit, typically a quad comparator, which comparator has a resistor ladder circuit to cause input signals to be excited and to deliver a discernable output signal to indicate to the battery user changes in internal resistance levels in such a battery cell or plurality of batteries.

The present invention also provides an optically isolated sensing means, using an opto-isolator, which in turn excites a transistor to turn on a relay that provides a discernable signal to a timing relay that battery failure is imminent. The timing relay times out the predetermined voltage failure "window" such as 24 hours, so that minor changes which are self corrected do not produce a false alarm output signal that the battery is in danger of imminent failure when it is not. The timing cycle can be repeated when an event that may cause a false alarm causes the system to remain in an alarming mode for extended periods of time. An example of this type of condition could be a failure within the battery charger that causes either extended hi-rate of equalization that does not return to a float mode in under 24 hours. Another example could be an opening of a dc fuse or breaker that in turn causes the battery to be in either the open circuit or loaded condition.

The device then acts as an additional failure mode indicator to augment such alarms that may be already present within the battery charger.

The temperature measurement portion of Applicant's invention is optional, but still very useful. It is well understood in the industry that a rise in temperature is a contributing factor toward battery failure. The temperature measurement can affect the voltage shift measurement which Applicant's inventive device makes.

When an application involves wide and protracted temperature shifts, the automatic temperature compensation device can correct for these changes in perceived battery voltage. Such applications would include but not be limited to batteries used for railroad signalling, outdoor controls and switchgear, stationary engine cranking etc.

In summary, the present invention provides a simple instrument which solves the long felt need to predict imminent failure of a battery in a float mode, without having to resort to time consuming guesswork while a battery is in a charging or discharging state of use.

The novel features which are considered characteristic for the invention are set forth in particular in the appended claims. The invention itself, both as to its construction and method of operation, together with additional objects and advantages thereof, will best become apparent and understood from the description of specific embodiments, when read in connection with the drawings.

DETAILED DESCRIPTION OF THE INVENTION

Figure 1:
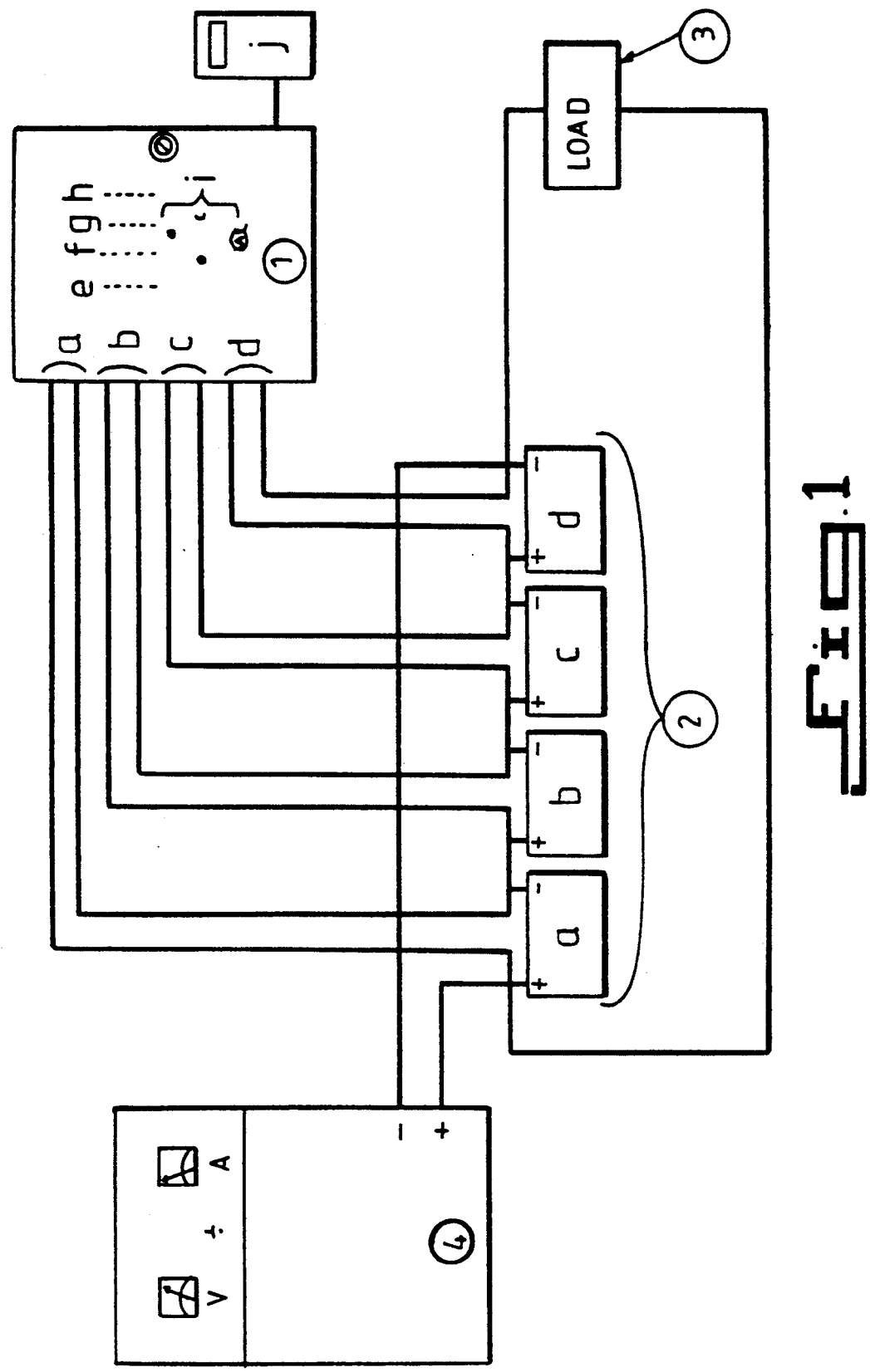
FIG. 1 is an electrical schematic of the device in accordance with the present invention.
Figure 2:
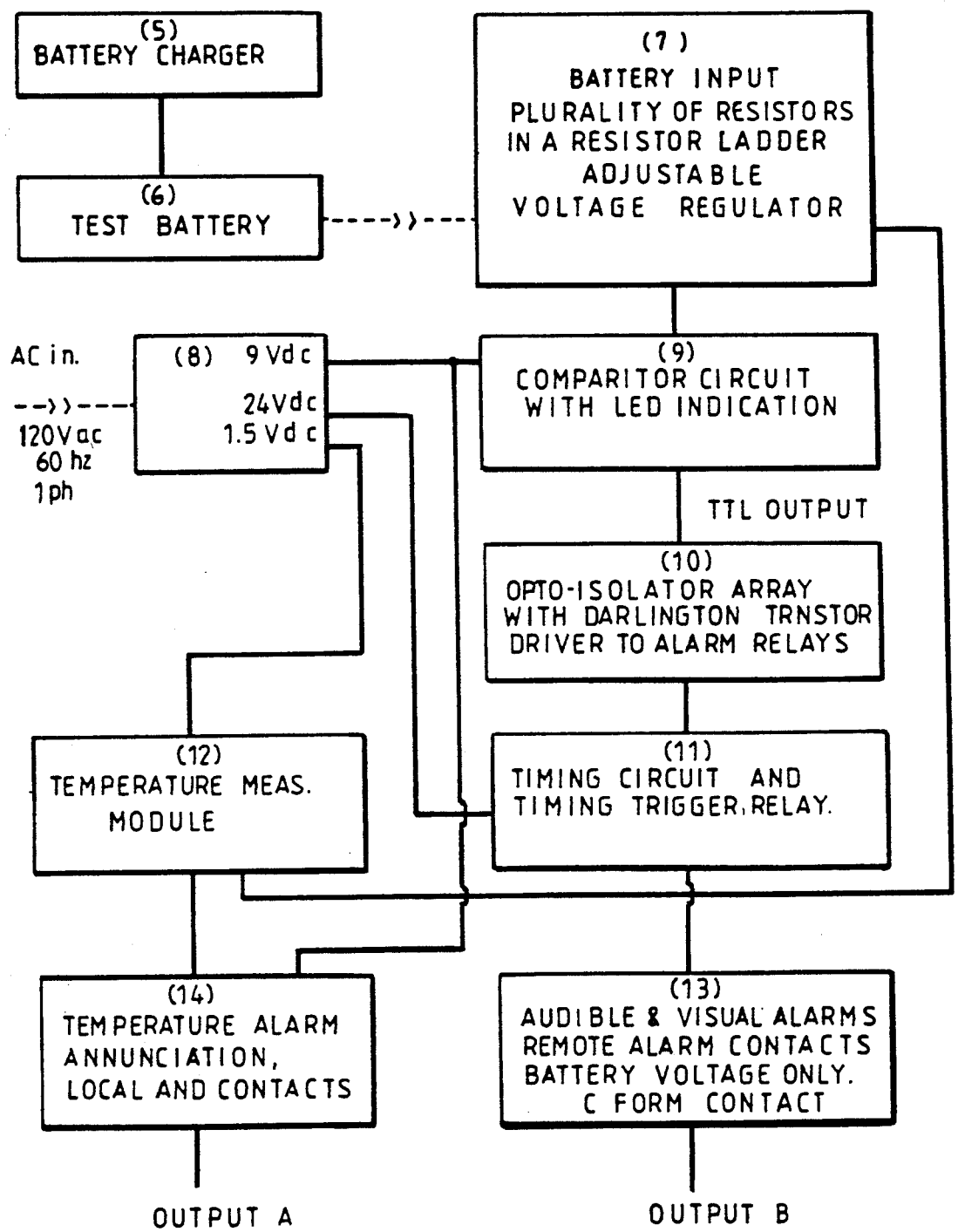
FIG. 2 is a block diagram of the device as shown in FIG. 1.

Referring to FIGS. 1 and 2, a single unit electronic instrument 1 capable of detecting failure in one or more sealed and non-sealed batteries of the lead acid variety is provided. Failure is noted by a slight change in voltage as experienced when such a battery nears failure. These variations in voltage are a function of the battery/cell units, designated in FIG. 1 as reference numerals 2a,2b,2c and 2d, either approaching a short or open situation wherein the internal resistance of one or more of the battery cell units 2a,2b,2c or 2d changes, thereby altering the voltage across any of battery/cell units 2a,2b,2c or 2d in relation to the voltage drop across the battery. When such a voltage change is noted and maintained in a float situation for a period of up to 24 hours continuously without regard to changes as a result of discharge or recharging at what is commonly referred to in the trade as "hi-rate" or "equalize", the inventive device 1 will indicate possible failure mode by means of both visual and audible alarms, in an alarm unit depicted in the block diagram depicted in FIG. 2 as reference numeral 13, as well as providing a C form contact and digital outputs for remote indication. As depicted in FIG. 1, on the face of the inventive device 1, reference letters "a", "b", "c", and "d" represent the connection locations at the inventive device 1 for each individual channel of monitoring. Also on the face of the inventive device 1 are depicted reference letters "e","f","g" and "h" representing the indicating LEDS used to determine which of the offending battery/cell units 2a,2b,2c or 2d are operating outside of the predetermined acceptable level of voltage while in a float mode, and which of said battery/cell units 2a,2b,2c or 2d are operating within acceptable limits of the predetermined acceptable level of voltage. Reference numeral "i" on the face of the inventive device 1 represents the cluster of visual and audible alarms indicating when an alarm condition occurs. These visual and audible alarms "i" are also designated as block "13" on the block diagram depicted in FIG. 2. Reference letter "j"represents the temperature indicating and alarm device, attached via an umbilical cord to the main part of the inventive device 1. This remote type attachment allows freedom of movement for this section since it needs to be closer to the battery in order to be effective in operation. The temperature indicating and alarm device "j" on FIG. 1 is also noted as blocks "12" and "14" of the block diagram described in FIG. 2.

As shown also in FIG. 1, reference numeral 3 depicts an ever-present dc load upon battery/cell units 2a,2b,2c and 2d and reference numeral 4 depicts a current limited battery charger.

FIG. 2 represents a block diagram of the circuitry of the device. The block designated as reference numeral 5 is the block containing battery charger 4, (as depicted in FIG. 1). The battery charger 4 is connected to the test battery/cell units 2a,2b,2c and 2d, (as depicted in FIG. 1) ,which collection of battery/cell units 2a,2b,2c and 2d is depicted as block "6" on the block diagram depicted in FIG. 2. Reference numeral 7 of FIG. 2 depicts the battery input adjustable regulator block portion of the device 1 and reference numeral 8 of FIG. 2 represents the power input into the inventive device 1. Reference numeral 9 of FIG. 2 represents the comparator circuit block portion of the inventive device 1.

As also shown in the block diagram depicted in FIG. 2, reference numeral 10 depicts the block with an opto-isolator array with a driver to alarm relays and reference numeral 11 depicts the timing circuit block of the inventive device 1. Finally, reference numerals 12,13 and 14 of FIG. 2 represent the blocks representing the temperature measurement module (depicted as "j" in FIG. 1), the audible and visual alarms "i" for the inventive device 1 and the temperature alarm (also depicted as "j" in FIG. 1) for the inventive device 1 respectively.

The optional separate temperature module depicted as reference letter "j" of FIG. 1 or reference numeral 12 in the block diagram of the device shown in FIG. 2, and remote alarm indicator 14, as shown in the block diagram of FIG. 2, monitors either ambient or single cell-/battery temperature. The temperature module "j" is equipped with the ability to display temperature by means of a liquid crystal display. Furthermore, the temperature module "j" provides high and low alarms, indication in either degrees C. or F., and provides one C form contact for remote indication. The temperature sensing unit designated as block 12 of FIG. 2 or "j" of FIG. 1 is a separate device, attached to the main system via a coiled umbilical cord technique, allowing the operator to take individual battery/cell readings of battery/cell units 2a,2b,2c or 2d.

The inventive device 1 system can also be equipped to provide a feedback circuit that will automatically adjust alarm limits by sensing the ambient temperature surrounding the battery.

In order to more fully describe the operation of the device, the remaining description of the preferred embodiment involves:

A) first, a discussion of the circuit descriptions,

B) second, a description of the operation of the inventive device 1, including the power circuits and the system description, C) third, a brief example of the inventive device in operation, and D) fourth, a discussion of alternative accessory embodiments, and finally, E) fifth, a detailed description of a typical application, including references to illustrative part numbers in a typical application.

A) CIRCUIT DESCRIPTION:

The system of the inventive device 1 employs standard DC type TTL (transistor to transistor logic) and CMOS (controlled metal oxide semiconductor) circuitry. It is a totally solid state device and uses no frequency induced excitation to operate.

Indication of a failed battery/cell unit 2a,2b,2c or 2d is by means of the aforementioned row of LEDS 1e,1f,1g or 1h, as depicted in FIG. 1, of the inventive device 1, which LED's 1e,1f,1g or 1h in arrangement will indicate whether a certain battery/cell unit of units 2a,2b,2c, and/or 2d has experienced the predetermined voltage change described above, and therefore is likely to fail soon.

B) OPERATION OF THE DEVICE:

1) Power Circuits:

The basic operating voltage for the device 1 is 24 vdc (volts direct current), and is provided by means of a separate prepackaged module. The output from the module is broken down in the power section designated as block "8" in FIG. 2, via several regulators, to 9 vdc to power the detecting circuitry and 1.5 vdc to power the alternative temperature controller j of the inventive device 1. The 24 vdc is taken out through a regulator to control the relay used to power a coil for a predetermined 24 hour duration time delay relay.

2) Detector Circuits:

As shown in the block diagram depicted in FIG. 2, detection is accomplished by using a simple adjustable voltage regulator, noted in block 7 of the block diagram described in FIG. 2, to both isolate and control the input to a voltage comparator circuit, noted as block 9 of the block diagram of FIG. 2. The regulator 7 provides consistency in the inputs and a high resistance across the terminals of battery /cell units 2a,2b,2c and 2d being measured. This high resistance provides a situation wherein the battery/cell units 2a,2b,2c or 2d are not subject to any load created by the inventive device 1 during use, as seen by the device 1 from application to application.

The regulator 7 is presented with a given input voltage that is pre-set to a certain usable value for the comparator 9. The voltage value then rises and falls in an exact pattern equal to the rise and fall of the actual battery voltage of batteries 2a,2b,2c and/or 2d. As the voltage varies the comparator 9 examines the voltage it sees through a resistor ladder circuit, associated with comparator 9, that causes the inputs to be excited as the voltage rises. This in turn delivers a signal from the comparator 9 equal to either 1 or 0. 1 equals a voltage higher than zero and will illuminate the appropriate LED's "1e","1f","1g" or "1h" to indicate a voltage level greater than the previous LED in the string.

As the second and fourth LED in the string of LEDs 1e,1f,1g and 1h is excited, so is an opto-isolator of the opto-isolator array depicted as block 10 of FIG. 2. As also depicted in block 10 of FIG. 2, the opto-isolator in turn excites a transistor to turn on a relay. This relay provides the signal to the timing relay, depicted as block 11 of FIG. 2, that indicates a failure mode.

The timing relay 11 then times out the failure mode for up to 24 hours before indicating a failure. If at any time the failure mode eliminates itself, even for a very short period of time, the timing aspect of the timing relay 11 will stop and begin the timing cycle all over again, so as to eliminate false alarms. The timing relay 11 is also used to directly indicate local alarms by using a single set of normally open contacts. A second set of contacts isolated from the internal alarm contact on the same relay 11 provides the dry C form contacts for remote indication.

Each circuit as described above constitutes a single channel capable of examining a single battery or cell 2a,2b,2c and/or 2d. However, since most batteries are in 6, 12 or 24 vdc, 48 vdc, 120 vdc and 240 vdc units, these channels can be "daisy chained" to effectively examine any battery voltage required. The input power supply is the only limitation to daisy chaining and at its current rating of 500 milliamperes it can easily power up to 20 channels for a total of 240 vdc of detection provided the battery is made up at 20 12 volt battery units. Similar combinations of differing cell/battery arrangements can be accommodated by altering the regulator and resistor valves to detect differing voltage windows, since a 240 volt battery, for example, can consist of 120 individual cells, so the application would require 5 individual systems of 20 channels each. This could be combined into one unit to monitor this particular battery by using a power supply capable of delivering 2.5 amps at 24 vdc. Along with one or even several temperature modules, the exact number and combination may be determined for each application.

3) System Description:

As previously discussed, the battery monitor of the present invention provides a prediction of imminent battery failure by means of monitoring a slight change in the voltage across battery/cell units 2a,2b,2c and/or 2d while a battery is in float service, that is, during a period of static non-use.

Unlike some of the examples provided by the prior art patents, the present inventive device 1 does not need to provide any indication of battery capacity.

The background of the system including the inventive device 1 is as follows:

During the life cycle of a lead acid storage battery, it develops either internal shorting or opening of mechanical type electrical paths. These "shorts or opens" occur as a result of several factors including the following:

* Shedding of plate material.
* Heat stress during discharge and recharge.
* Normal consumption and abnormal consumption of plate material due to the sulphation process.
* Mechanical stress.
* Electrochemical stress.

In the final analysis the results of the "shorting or opening" of the battery will ultimately alter the internal resistance. This alteration can provide either an increase or decrease of the internal resistance.

Assuming a normal float voltage window is 2.25 vpc (volts per battery cell) +/−0.20 vpc when the voltage falls below 2.16 vpc, shorting is occurring and above 2.35 vpc an opening is occurring. When this change exceeds these volts per cell limits that is an indication that the internal damage that creates this voltage change has become so severe that the battery/cell units 2a,2b,2c and/or 2d will fail within 30 to 90 days of subsequent float service use. This failure means that the battery/cell units 2a,2b,2c and/or 2d can no longer deliver the manufactured specified AH rating, but rather would be valued at something less than 45% to 50% of rated ampere hour capacity, in the case of an internal short which is drawing the batteries useful capacity. When in an open or impending open circuit no useful current could be extracted in the extreme case (full open circuit). That is a value well below what would be considered useful.

The reason that the change in voltage occurs, and is detectable, has to do with the use of battery/cell units 2a,2b,2c and/or 2d. The battery/cell units 2a,2b,2c, and/or 2d must be in float service. This means each battery is always attached to a live battery charger 4 that is maintaining a manufacturer specified float voltage at a constant level across the battery. The industry terms this type of battery charger, depicted as reference numeral 4 in FIG. 1, a constant voltage, current limited float charger type.

With this activity in mind the battery/cell units 2a,2b,2c and/or 2d are then viewed as a constant load, made up from a series of small loads in series across the output of the battery having battery/cell units 2a,2b,2c and/or 2d. These small loads act as resistors, so that if one alters the resistance of one resistor in a series string so as to change its voltage drop, each and every other individual resistor will automatically, in accordance with the theories of Ohm's law, take on a proportional and equal segment of that voltage.

C) BRIEF EXAMPLE OF OPERATION OF THE INVENTIVE DEVICE

The following example illustrates the operation of the present invention:

If one has a lead acid battery with battery/cell units 2a,2b,2c, and/or 2d of 48 vdc and the float voltage across that battery is exactly 48 volts and one needs 24 cells to achieve one's 48 vdc, than it would stand to reason that each cell 2a,2b,2c or 2d being of equal resistance would then display a 2 vdc drop if measured at the cell terminals.

Now if the internal resistance of one of the battery/cell units is changed so as to drop to 1.5 vdc, then the remaining 0.5 vdc will be spread over the entire battery so that each cell will then rise 0.02173 vpc. If one takes measurements across the terminals of each individual cell 2a,2b,2c or 2d, the affected cell will measure 1.5 vdc while the remaining 23 cells will each measure 2.02173 vpc.

While the example cited above is simplified for explanatory purposes, actually all battery cells will not be that exact in terms of their internal resistance. That is why the present inventive device 1 employs a voltage regulator 7 in the input side of the device. This allows one upon installation to set the voltage threshold seen at the input side of the device 1 so as to have the device 1 see a specific voltage upon installation, and then refer to that voltage during the life of the battery, by initially setting up the regulator 7 to achieve a voltage window when the battery is new. As time goes on and the voltage changes due to a change in internal resistance, the present inventive device 1 compares that change to the installed voltage and not an arbitrary number. This accounts for greater accuracy and also customizes the inventive device 1 to the characteristics of the actually installed battery and not some arbitrary number determined by a battery manufacturer's specification.

D) ALTERNATE ACCESSORY EMBODIMENTS:

Although the foregoing examples given have dealt with a 48 vdc DC battery, it is important to note that the present invention can easily be built to accommodate any battery set up or voltage condition, without limitation. Since the inventive device 1 was designed to be modular, the detection circuitry can be either brought together or broken out as separate units as an application may dictate. The present invention is not limited to a single voltage level or battery configuration. It is fully adjustable both at the regulator side as well as the detector side to accommodate any voltage scenario possible.

Although the schematic and block diagrams shown in FIGS. 1 and 2 show the way of developing the circuit of a preferred embodiment, other alternative embodiments may be employed. While the preferred embodiment employs a TTL, (transistor to transistor logic), DC type design, it is both acceptable and practical to employ other electronic techniques such as microprocessors to achieve the same electrical/electronic result. A critical advantage of the present invention is that the inventive device 1 deals with a measurement technology not currently being used and that the electronic components and methods to capture, process and control this technique are not as important as the overall technological combination itself.

The aforementioned temperature device "j" may be added to the present inventive device 1 to provide several important functions. A linear or digital output, as noted as block 14 of FIG. 2, from the temperature sensor will also provide ambient temperature information to the detector device. This information will be used to alter the output detection threshold of the inventive device 1 so as to account for its effects in monitoring the voltage of battery/cell units 2a,2b,2c and/or 2d. As the ambient temperature changes so does the voltage drop across the battery/cell units 2a,2b,2c and/or 2d, therefore the temperature device "j" can also be used to help eliminate false alarms, by monitoring the ambient temperature and altering the detection threshold in proportion to those changes.

Therefore the temperature monitor j can be used in a feed-back control loop to automatically compensate for the changes in ambient temperature, by setting the alarm threshold in accordance with certain temperature limits, thereby precluding false alarms.

E) DETAILED DESCRIPTION OF A TYPICAL APPLICATION

A acceptable application of the inventive device 1 is one that employs a dual rate charging capability, using a constant voltage, current limited charging technique with any type of stationary lead-acid battery.

The test battery which is being monitored has terminal connectors applied to each accessible terminal set, including one positive and one negative terminal. Depending on the size and design of a given battery, the terminal sets that are available for monitoring can be either a single cell, (nominal 2.00 vdc) or, in batteries of smaller capacities, the terminal set may represent several cells joined in series. Such typical multiple cell groupings are represented as a nominal 4.00 vdc, 6.00 vdc, or 12.00 vdc. Other multiples can be assembled as well, depending on how the batteries were manufactured.

The inventive device 1 can be adjusted to accommodate any battery multiple by altering the resistor settings within both the Battery Input Adjustable Regulator 7 and the Comparator Circuit 9.

The test battery, once connected to the Battery Input Adjustable Regulator 7, has a separate regulator for each terminal set being monitored. The regulator is similar to the type LM317T or equivalent. This regulator is adjusted over a wide voltage range from 1.2 vdc to 37 vdc. Adjustment is accommodated by means of a resistor/capacitor (RC) circuit. This circuit provides an acceptable voltage picture to the Comparator Circuit 9, that will essentially set up acceptable limits of indication, for the range of the voltage window to be monitored.

The LM317T type regulator can also be installed in the circuit to shift its range or response when stimulated by an external signal, such as that which a temperature module, such as "j" in FIG. 1 and block 12 of FIG. 2, can deliver. This signal can be processed several ways either through a microprocessor or by using a type 308 Operational Amplifier, or similar component which uses the signal from the temperature module "j" to bias a transistor, such as a 2N2905, which in turn could drive the LM317T regulator to alter its detectable range and therefore, would automatically compensate for a temperature shift by shifting the voltage window being monitored.

Within the Comparator Circuit 9, including LED indicators 1e, 1f, 1g and 1h, is a plurality of resistors to which the array is headed by an adjustable resistor, capable of setting a voltage window range suitable for detection. The range is set in conjunction with setting the range for the Regulator 7, so that the ultimate window range is achieved for a given individual application. Additionally the resistors' value can be changed in design to accommodate differing detection ranges by the system. Each resistor must be of the same value. However, by altering the value of all of them to a new value, the discrimination between detectable points of the monitor can be either increased or decreased. It is important that each of these resistors be of the low tolerance, high precision type, as this could ultimately affect the accuracy of the inventive device 1 in application.

The resistor network described is used to drive a Quad Comparator 339 or similar device. This comparator will observe the voltage changes as mentioned, from the resistor network, and provide digital outputs over the range of the voltage window desired. The outputs are capable of driving LED components 1e, 1f, 1g, or 1h and the LEDS will provide the visual indication of the exact point within the desired voltage window for the battery system.

These same outputs from the comparator 9, such as Quad Comparator 339, also provide the necessary digital signals to operate the opto-isolator 10. The opto-isolator 10 includes 2 optocouplers similar to commercially available type TIL127. As also included in opto-isolator array 10, the optocoupler comes in a standard 6 pin DIP package with an infrared LED (transmitter) and an IR type phototransistor (receiver).

The aforementioned phototransistor is contained within the DIP using the standard Darlington TTL method. This technique is used so as to isolate completely the higher voltages required for the alarm relays, from the lower signal voltages coming from the Quad Comparator 339, thereby protecting the sensitive circuitry. In the final analysis, the opto-isolator 10 includes two small PC type SPDT relays, installed and driven by a transistor of a type similar to a 2N2222 to provide a usable output for the timing circuit and alarm triggers. The optocouplers of opto-isolator array 10 are only present on the outputs of comparator 9, such as Quad Comparator 339, at pins customarily designated as pins 2 and 14. These pins when excited indicate the threshold for the high and low points in the measured voltage window. Whenever these points are violated, a signal in terms of a voltage must be given to the timing circuit 11 to begin its countdown before failure is actually initiated.

The timing circuit and timing trigger relay 11 includes an electronic time delay relay capable of timing out a response delay after being energized of up to 24 hours, for example, a pre-packaged device manufactured by Diversified Electronics (Model #TDC-024-AKA-24H) 11. The coil is able to operate on 24 vdc which is supplied by the power section 8, through the PC relays in opto-isolator array 10.

Once energized, the time delay relay of block 11 of FIG. 2, adjusted for a 24 hour delay before actuation, will wait the delay period out and then sound an alarm. Within this block 11 is a cancel switch which interrupts the 24 vdc to the relay momentarily. This interruption will cancel the alarm action for another 24 hours. If the problem has not been corrected in that time period another alarm indication will occur.

The alarms themselves are in 4 distinct forms within alarm section 13.

First—There is a visual alarm provided by a flashing LED similar to type F1363SRC/1. This particular LED system has a self contained flashing circuit with a pulse rate of 3 hz. The luminous intensity parameter is measured at 350 mcd and it has a spectral line half width of 20 nm;

Second—A piezo electric buzzer is activated;

Third—A spare "C" form dry contract is available to activate any remote alarms as required;

Fourth—Actual digital sensing information can be taken directly from the outputs of the comparator 9, such as Quad Comparator 339 IC.

The temperature measurement module j is a self contained package similar to the TL83969 package. It has a range capability from 20 deg. C. to 110 deg. C. (68 deg F. to 230 deg. F.). The accuracy of the device in a standard configuration using the sensor as supplied with the package is +/−1 degree C. The working voltage of the device is 1.5 vdc which is supplied by a separate LM317T regulator resistor circuit located in the power section 8. The heart of this device is a CMOS (Controlled Metal Oxide Semiconductor) chip, capable of interpreting temperature information, provided through a thermistor type sensor, matched to the unit and supplied as part of the package.

The temperature device "j" has the capability of supplying outputs for hi and low temperature limit alarms. This enables the unit to provide information back to the battery input adjustable regulator 7 and the comparator circuit 9 for temperature compensation. Temperature alarms 14 can be annunciated locally to excite a flashing LED similar to type F1363SRC/1 as previously mentioned. However in this case the LED would be labeled to specifically indicate a temperature alarm. The output would also be sent to the audible piezo alarm, which could be common for all indication scenarios. The temperature module "j" can also provide digital outputs for temperature alarm indications in remote areas or to close a relay through a transistorized driver 14 such as a 2N2222 transistor or similar device feeding a PCB type relay device.

This display on the TL83969 temperature module "j" is an LCD alpha-numeric, with 3.5 digits and a floating decimal point. The display is self driven with an internal driving circuit.

The temperature module 12 of temperature device "j" also can be supported during a commercial power faiure with an internal battery, (lithium type suggested) so as to provide operation during a power failure. While the rest of the inventive device does not operate during a power failure, the temperature module "j" can provide critical temperature measuring information during a battery discharge, that could also be helpful in predicting imminent battery failure.

The power section 8 is designed to deliver the various control voltages required with adjustability available. This power section 8 includes a plurality of voltage regulators, similar to the type LM317T using a resistor network, so as to provide adjustability. The LM317T also has excellent (80 db) ripple rejection making the accuracy and consistency of the detection circuits more stable. Each voltage level required requires a separate LM317T regulator circuit adjusted for its need. The inventive device 1 is powered through a standard commercially available transformer/rectifier that is capable of converting 120 vac, 60 hz, 1 phase power into 24 to 32 volt DC power. The DC output is then taken by the regulator's from a common bus and distributed to the individual circuits as required at the prescribed voltage levels.

To summarize, as shown in FIGS. 1 and 2, there is provided a typical stationary battery installation with battery/cell units 2a,2b,2c and 2d, with a constant voltage, current limited battery charger designated as reference numeral 4, a stationary lead-acid battery consisting of four separate battery/cell units designated as reference numerals 2a,2b,2c and 2d, an ever-present dc load, designated as reference numeral 3, and the inventive stationary battery testing device, designated as reference numeral 1, installed at each accessible terminal set.

It is important to note that while drawing FIGS. 1 and 2 typify a standard generic stationary battery installation, many other possibilities do exist for using this device. Other examples would include a UPS system that converts the DC back to AC for use by the load. Another such installation would be such where multiple series strings of batteries are also in turn paralleled so as to provide more current to the load. An understanding of the many other types of installations that would be suitable for this invention can be identified within ANSI/IEEE STD 446-1987, IEEE Recommended Practice For Emergency And Standby Power Systems.

In the drawings the inventive device 1 is pictured to show certain key attributes. FIGS. 1 and 2 are modeled after an engineering model built, and not necessarily a rendition of a full production version of the inventve device 1.

The present invention is not limited to the details shown, since various modifications and circuitry changes are possible without departing in any way from the scope and spirit of the present invention.

What is desired to be protected by Letters Patent is set forth in the appended claims.

We claim:

1. A device for predicting an imminent failure of a stationary lead acid battery/cell comprising a means for monitoring a first predetermined upper voltage limit of said battery/cell and a means for monitoring a predetermined lower limit thereof in a float mode, said float mode comprising a condition in which said battery/cell's voltage level is in an electrical equilibrium, being neither substantially electrically charged nor substantially electrically drained in the float mode, said float mode comprising;

a) a float voltage level, said float voltage level being intermediate between said upper voltage limit and said lower voltage limit, the device further comprising:

(b) a current limit battery charger maintaining said voltage level across said battery/cell, said current limiting battery charger causing and maintaining said battery float mode;

(c) said means for monitoring a predetermined upper voltage limit, said means for monitoring a predetermined lower voltage limit and said means for monitoring a float voltage level producing respective output signals, said output signals being fed up to a comparator means;

d) said comparator means being for comparing said float voltage output signals with said predetermined upper voltage limit and said lower voltage limit, said comparator means generating an alarm output signal as required, said upper and lower voltage limits serving as reference values, said comparator means further being capable of delivering discernable output signals in response to input of said predetermined float voltage level across said battery/cell;

e) said discernable comparator output signals being indicative of changes in said float voltage level of said battery/cell and, f) means for warning a user of an imminent failure of said battery/cell, said warning means comprising a first transistor and alarm means for generating an alarm signal perceivable by said user, said first transistor capable of energizing said warning means and said first transistor responsive to said discernable comparator output signals and, said first transistor capable of energizing said alarm means for warning a user of imminent battery failure of said battery/cell, said device further having g) a time measurement means for measuring a predetermined interval, said time measurement means providing output signals capable of being fed to said comparator means, said time interval measurements being critical to the operation of said comparator means;

h) said comparator means requiring a predetermined time interval for determining when to generate an alarm output change as required, said alarm signal output being required when said comparator means has detected a battery/cell float voltage level which has exceeded said predetermined upper voltage limit or said predetermined lower voltage limit for a time period exceeding said predetermined time interval and further:

i) said comparator means being capable of delaying an alarm response until an expiration of said predetermined time interval.

2. The device as in claim 1 wherein said device is further provided with a means to isolate and control float voltage monitor signals means, said means to isolate and control said voltage monitor output signals comprises a voltage regulator, said voltage regulator being capable of isolating and controlling said float voltage monitor signals being fed into said comparator means, further wherein:

said comparator means comprises a comparator, circuit having a resistor ladder circuit therein; said resistor ladder being a circuit capable of causing input signals to be discernable to deliver said output signals.

3. The device as in claim 1, further comprising a second transistor and an optically isolated sensing means capable of exciting said second transistor, and a battery failure alarm relay, wherein said second transistor is responsive to energizing said battery failure alarm relay, which said relay in turn, energizes said alarm means to produce a sensible alarm indicating imminent battery failure.

4. The device as in claim 3 wherein said optically isolated sensing means comprises an opto-isolator array with Darlington transistors driving said battery failure alarm relay.

5. The device as in claim 1, further comprising a temperature indicating means, said temperature indicating means being responsive to monitoring ambient temperature and temperature of single cells within a monitored battery/cell.

6. The device as in claim 5 wherein said temperature indicating means is capable of providing alarm signals in response to both high and low measured temperatures, said temperature indicating means further providing a remote temperature indication output.

7. The device as in claim 1, further comprising an automatic feedback control loop having a temperature-controlled alarm threshold, said loop capable of measuring said first predetermined upper limit of a voltage level and said second predetermined lower limit of a voltage level.

8. The device as in claim 2 wherein said voltage regulator has a preset input voltage, said voltage regulator capable of regulating said float voltage monitor signals emanating from said battery/cell in a float mode; said float voltage monitor signals being fed to said comparator, said comparator further being capable of evaluating a predetermined deviating fluctuation pattern of voltage monitor signals in comparison to expected norms for said fluctuations of voltage in a monitored battery/cell and further wherein:

a) said resistor ladder circuit capable of receiving said float voltage monitor signals emanating from said battery/cell in a float mode, said resistor ladder circuit causing said fed voltage monitor signals to be incrementally transmitted as said voltage value of said fed float voltage monitor signals fluctuates; and b) said comparator being capable of converting analog signals to digital signals, said digital signals in turn being indicative of a voltage greater than zero or a voltage of zero.

9. The device as in claim 3 wherein said battery failure alarm relay comprises a timing relay, said timing relay being capable of indicating imminent battery failure after a predetermined time interval.

10. A battery-life indicator that predicts failure of a stationary battery/cell within a predetermined minimum warning time period before occurrence of actual battery/cell failure, comprising:

a) a sensing means for sensing a change in the internal resistance of a battery/cell, said sensing means including a monitoring means to monitor a float voltage across a battery/cell, said monitoring means being responsive to changes in said float voltage;

b) indicating means for indicating changes in said float voltage of a battery/cell, and further for indicating whether the fluctuations in battery/cell float voltage represent a change in said battery/cell's internal resistance, further c) said monitoring means being responsive to changes in an internal structure of said battery/cell;

d) said monitoring means further including a plurality of resistors and a comparator, said monitoring means receiving and continuously comparing said monitored battery/cell float voltage level to predetermined upper or lower normative values within a normative range, said normative float voltage range being comprised of a range of voltage values between said upper and lower float normative voltage levels, said comparators being capable of operating an alarm signal indicating that said battery/cell float voltage exceeds said normative float voltage range of said float voltage window;

e) a series of visual indicator means responsive to said comparator, said series of visual indicators for providing a visual indication of an instant battery float voltage level as compared to said normative float voltage range.

11. The battery life indicator of claim 10 further comprising:

a) at least one transistor;

b) at least one opto-isolator capable of exciting said, at least one transistor, c) one or more battery/cell failure alarm relays capable of providing a time delay, wherein d) said at least one transistor is responsive to an excitation of said at least one transistor provided by said at least one opto-isolator by energizing said one or more battery/cell failure alarm relays, which said relays after a time delay, and in response to a battery/cell float voltage deviation outside of a float voltage window of normative values for a period of time greater than a preset temporal interval, energize said alarm means to produce a sensible alarm indication of imminent battery/cell failure.

12. The battery life indicator as in claim 11 wherein said one or more battery failure alarm relays further comprises an alarm circuit including a flashing light emitting diode, an audible signal, and a digital output, all of which are activated by a required activating input from said one or more time delay relay.

13. The battery life indicator as in claim 12, further comprising a temperature measurement module for indicating ambient, single battery/cell and single cell temperature, the ambient temperature measurement further providing a feedback signal to said battery life indicator to compensate for shifts in ambient temperature which could affect the accuracy of said battery/cell life indicator, the temperature measurement module further comprising a temperature alarm system providing audible, visual, electronic and switching indications of predetermined high or low temperature events.

* * * * *